United States Patent
Kotani et al.

(10) Patent No.: US 9,871,147 B2
(45) Date of Patent: Jan. 16, 2018

(54) PHOTODETECTOR

(71) Applicants: Sharp Kabushiki Kaisha, Sakai, Osaka (JP); The University of Tokyo, Bunkyo-ku, Tokyo (JP)

(72) Inventors: Teruhisa Kotani, Sakai (JP); Yasuhiko Arakawa, Tokyo (JP); Tetsu Tatsuma, Tokyo (JP)

(73) Assignees: SHARP KABUSHIKI KAISHA, Sakai (JP); THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 15/352,632

(22) Filed: Nov. 16, 2016

(65) Prior Publication Data
US 2017/0141243 A1   May 18, 2017

(30) Foreign Application Priority Data

Nov. 18, 2015   (JP) ................................. 2015-225859

(51) Int. Cl.
*H01L 31/0236* (2006.01)
*H01L 31/0224* (2006.01)
(Continued)

(52) U.S. Cl.
CPC ............... *H01L 31/022408* (2013.01); *H01L 31/02327* (2013.01); *H01L 31/03044* (2013.01);
(Continued)

(58) Field of Classification Search
CPC ......... H01L 31/02363; H01L 31/03046; H01L 31/1844; H01L 31/022408; H01L 31/109; H01L 31/035236
See application file for complete search history.

(56) References Cited

U.S. PATENT DOCUMENTS

| | | | |
|---|---|---|---|
| 5,804,833 A * | 9/1998 | Stettner | G01T 1/24 257/10 |
| 7,977,637 B1 * | 7/2011 | Yap | B82Y 20/00 250/338.4 |

(Continued)

FOREIGN PATENT DOCUMENTS

| | | |
|---|---|---|
| JP | 2000-323694 A | 11/2000 |
| JP | 2012-074634 A | 4/2012 |

(Continued)

OTHER PUBLICATIONS

Levine et al., "Photoexcited escape probability, optical gain, and noise in quantum well infrared photodetectors", Journal of Applied Physics, 72(9), Nov. 1, 1992, 16 pages.

(Continued)

*Primary Examiner* — Nikolay Yushin
(74) *Attorney, Agent, or Firm* — Keating & Bennett, LLP (57) ABSTRACT

A photodetector including a substrate, a light absorption layer arranged over the substrate, the light absorption layer including a stack including a semiconductor layer that absorbs light of a wavelength having an electric field vector parallel to a normal direction of a substrate surface, a lower contact layer arranged on a first side of the light absorption layer, a lower electrode contacting with the lower contact layer, an upper contact layer arranged on a second side of the light absorption layer, and an upper electrode contacting with the upper contact layer. An uneven structure including polarization-selective shapes of projections or depressions on the second side of the upper contact layer is provided, the shapes of projections or depressions each having a size of a wavelength or less of incident light in the semiconductor layer and half the wavelength or greater and being periodically arranged in at least one direction.

7 Claims, 8 Drawing Sheets

(51) Int. Cl.
*H01L 31/0304* (2006.01)
*H01L 31/0352* (2006.01)
*H01L 31/0232* (2014.01)
*H01L 31/09* (2006.01)

(52) U.S. Cl.
CPC .. *H01L 31/03046* (2013.01); *H01L 31/03048* (2013.01); *H01L 31/035236* (2013.01); *H01L 31/09* (2013.01)

(56) References Cited

U.S. PATENT DOCUMENTS

| | | | |
|---|---|---|---|
| 2008/0073640 A1* | 3/2008 | Arakawa | B82Y 10/00 257/14 |
| 2011/0285942 A1 | 11/2011 | Guo et al. | |
| 2012/0073651 A1 | 3/2012 | Fujimoto et al. | |
| 2012/0112165 A1* | 5/2012 | Charlton | H01L 27/14603 257/21 |
| 2013/0146131 A1* | 6/2013 | Cuony | H01L 31/0236 136/255 |
| 2014/0083489 A1* | 3/2014 | Lai | H01L 31/02363 136/251 |
| 2014/0319637 A1 | 10/2014 | Nakajima et al. | |
| 2017/0194522 A1* | 7/2017 | Wang | H01L 31/035281 |

FOREIGN PATENT DOCUMENTS

| | | |
|---|---|---|
| JP | 2012-083238 A | 4/2012 |
| JP | 2013-115418 A | 6/2013 |
| JP | 2013-525863 A | 6/2013 |
| JP | 2015-173060 A | 10/2015 |
| WO | 2014/174866 A1 | 10/2014 |

OTHER PUBLICATIONS

Nishino et al., "Quantum well infrared photodectors", Fujitsu, 56, 4, Jul. 2005, 21 pages.

* cited by examiner

PHOTODETECTOR

BACKGROUND

1. Field

The present disclosure relates to a photodetector having high photoelectric conversion efficiency with respect to incident light in a perpendicular direction.

2. Description of the Related Art

In the related art, there is known a semiconductor infrared sensor that uses a quantum well (for example, see B. F. Levine et al., "Photoexcited escape probability, optical gain, and noise in quantum well infrared photodetectors", Journal of Applied Physics, 72(9), (1992)). The quantum well infrared photodetector described in the above document converts incident infrared light to an electric current by using intersubband transition of electrons or holes. In the case of the quantum well infrared photodetector, the intersubband transition occurs only for light in an electric field vector that is parallel to the direction in which quantum wells are stacked. Therefore, such a quantum well infrared photodetector does not have sensitivity to incident light in a direction perpendicular to the substrate surface.

In contrast, Japanese Unexamined Patent Application Publication No. 2000-323694 and Hironori Nishino et al., "Quantum well infrared photodetectors", Fujitsu. 56, 4, pp. 352-357 (2005) describe a photodetector having a grating (diffraction grating) structure for diffracting light in an oblique direction, the light being incident in the perpendicular direction. By diffracting incident light in an oblique direction, the electric vector in the direction perpendicular to the direction in which quantum wells are stacked is converted to an electric vector in the parallel direction, whereby sensitivity to the perpendicular incident light can be achieved.

Further, in the infrared sensor that uses a quantum dot or a quantum well disclosed in Japanese Unexamined Patent Application Publication No. 2012-083238, an electrode on the surface has circular holes that are arranged in a square lattice so that a surface plasmon generated on the electrode is coupled to the quantum dot or quantum well, thereby enabling the sensitivity to be increased.

However, as described in Hironori Nishino et al., "Quantum well infrared photodetectors", Fujitsu. 56, 4, pp. 352-357 (2005), light diffracted by a grating becomes propagated light. Therefore, unless the absorption coefficient of a light absorption layer is sufficiently high, most of the converted light passes through the light absorption layer, and thus, it has been difficult to obtain high photoelectric conversion efficiency.

In addition, the configuration described in Japanese Unexamined Patent Application Publication No. 2012-083238 does not have selectivity to a polarization direction in a plane of incidence of the incident light. In order to obtain polarization characteristics, a polarization filter or the like has had to be additionally provided.

SUMMARY

It is desirable to provide a photodetector having high photoelectric conversion efficiency with respect to incident light in a perpendicular direction.

According to an aspect of the disclosure, there is provided a photodetector including a substrate, a light absorption layer arranged over the substrate, the light absorption layer including a stack that includes a semiconductor layer designed to absorb light of a specific wavelength having an electric field vector that is parallel to a normal direction of a surface of the substrate, a lower contact layer arranged on a side of the light absorption layer, the side being close to the substrate, a lower electrode provided to contact with the lower contact layer, an upper contact layer arranged on a side of the light absorption layer, the side being away from the substrate, and an upper electrode provided to contact with the upper contact layer. An uneven structure including shapes of projections or depressions on the side of the upper contact layer away from the substrate is provided, the shapes of projections or depressions each having a size less than or equal to a wavelength of incident light in the semiconductor layer and greater than or equal to half the wavelength, having a polarization selectivity, and being periodically arranged in at least one direction.

DESCRIPTION OF THE EMBODIMENTS

Embodiments of the present disclosure will be described below with reference to the drawings. Note that like reference numerals represent the same or similar elements, and repeated description thereof in the explanation of the drawings will be omitted.

First Embodiment

Figure 1:
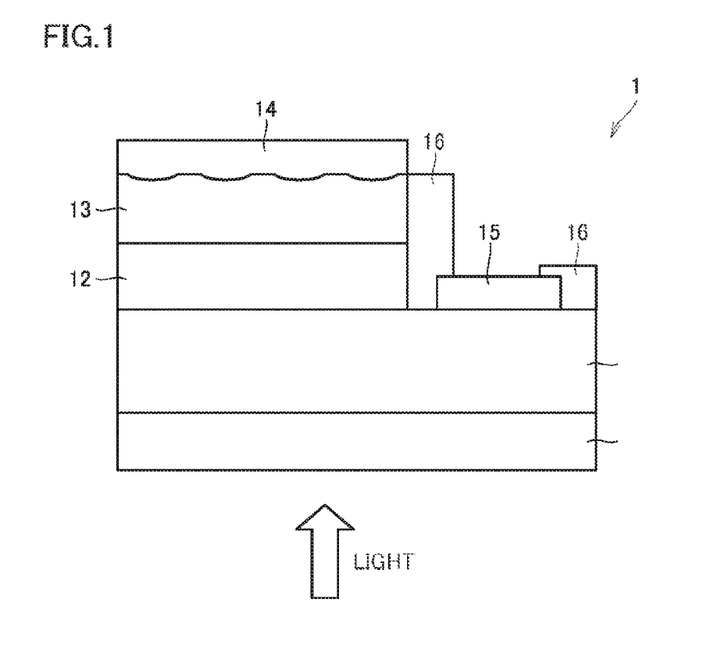
FIG. 1 schematically illustrates a configuration of a photodetector according to a first embodiment.

FIG. 1 schematically illustrates a configuration of a photodetector 1 according to a first embodiment. The photodetector 1 includes a substrate 10, a lower contact layer 11 formed on the substrate 10, a light absorption layer 12 formed on the lower contact layer 11, an upper contact layer 13 formed on the light absorption layer 12, an upper electrode 14 provided on a side of the upper contact layer 13, the side being away from the substrate 10, and a lower electrode 15 to contact with the lower contact layer 11, the lower electrode 15 being provided in the manner illustrated in FIG. 1. In addition, in the embodiment illustrated in FIG. 1, it is assumed that light is incident from the substrate 10 side.

Lower Contact Layer

The lower contact layer 11 is provided in order to realize electrical contact with the lower electrode 15.

Light Absorption Layer

Figure 2A:
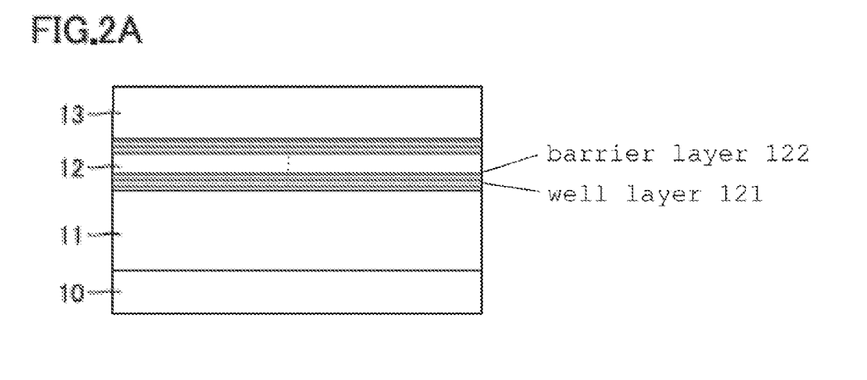
FIGS. 2A through 2E illustrate a method for producing the photodetector illustrated in FIG. 1 step by step.

The light absorption layer 12 is a layer that converts incident light to electrons (performs photoelectric conversion) by using intersubband transition of electrons. As shown in FIG. 2A, the light absorption layer 12 may be formed by using quantum wells in which a thin well layer 121 is sandwiched between barrier layers 122 having a band gap greater than that of the well layer and in which the thin well layer 121 and the barrier layer 122 are alternately stacked.

Upper Contact Layer

The upper contact layer 13 is provided in order to realize electrical contact with the upper electrode 14. FIG. 1 illustrates an exemplary case where the upper contact layer 13 has, on the side away from the substrate 10, an uneven structure in which shapes of projections or depressions each having a size less than or equal to a wavelength of incident light in the semiconductor layer and greater than or equal to half the wavelength and having a polarization selectivity are periodically arranged in at least one direction.

Lower Electrode

The lower electrode 15 is provided in order to extract electrons generated by photoelectric conversion.

The lower electrode 15 may be formed of a metal such as gold (Au).

Upper Electrode

The upper electrode 14 is provided in order to extract electrons generated by photoelectric conversion as in the lower electrode 15. In addition, in the case where the upper electrode 14 has an uneven structure, the upper electrode 14 has a function of converting the polarization direction of incident light and generating a surface wave in the vicinity of the upper electrode 14. On the upper electrode 14 on the substrate 10 side, that is, at the interface with the upper contact layer 13, the uneven structure having a cycle is provided as will be described later. The uneven structure having a cycle is, for example, a case where each depression has a semiellipsoidal cross section. FIG. 1 illustrates a case where the upper electrode 14 on the substrate 10 side has an uneven structure corresponding to an uneven structure on a side of the upper contact layer 13, the side being away from the substrate 10, in such a manner as to fill depressions in the uneven structure on the upper contact layer 13. Note that a metal layer having an uneven structure corresponding to the uneven structure on the upper contact layer 13 may be provided adjacently to the uneven structure of the upper contact layer 13, and the upper electrode 14 may be stacked on this metal layer.

Dopant

The lower contact layer 11, the upper contact layer 13, and the well layers 121 are doped to be n-type. Note that the barrier layers 122 may be doped instead of the well layers 121, or both of the barrier layers 122 and the well layers 121 may be doped.

External Configuration

The above-described layers are stacked in the manner illustrated in FIG. 1 and are processed to have a mesa shape. The lower electrode 15 is formed on an exposed portion of the lower contact layer 11. In addition, an insulation film 16 formed of silicon dioxide ($SiO_2$), for example, is provided in such a manner as to cover all the side surfaces except for the electrodes.

Production Method

A method for producing the photodetector 1 illustrated in FIG. 1 will be described below.

1. Formation Process (Epitaxial Layer)

The substrate 10, the lower contact layer 11, the light absorption layer 12, and the upper contact layer 13 illustrated in FIG. 1 are formed through epitaxial growth. Here, FIGS. 2A through 2E illustrate the method for producing the photodetector 1 illustrated in FIG. 1 step by step.

First, as illustrated in FIG. 2A, an epitaxial wafer is formed. The substrate 10 is a semi-insulating gallium arsenide (GaAs) substrate, the lower contact layer 11 is an n-type GaAs layer with a thickness of 1000 nm and an impurity density of $5 \times 10^{17}$ cm$^{-3}$, the light absorption layer 12 includes multiple quantum wells (with a total thickness of 300 nm) including about thirty layers in which i-type aluminum gallium arsenide ($Al_{0.25}Ga_{0.75}As$) barrier layers 122 each with a thickness of 5 nm and n-type GaAs quantum well layers 121 each with a thickness of 5 nm and an impurity density of $5 \times 10^{17}$ cm$^{-3}$ are alternately stacked, and the upper contact layer 13 is an n-type GaAs layer with a thickness of 50 nm and an impurity density of $5 \times 10^{17}$ cm$^{-3}$. Each of the above-described layers is obtained through epitaxial growth on the substrate 10 by metal-organic chemical vaper deposition (MOCVD) or molecular beam epitaxy (MBE).

In the production of the photodetector 1, an etch stop layer and a buffer layer have to be provided, the etch stop layer being provided in order to enable selective etching of each of the epitaxial layers formed on the epitaxial wafer, the buffer layer being provided in order to suppress degradation of characteristics of each of the epitaxial layers. Therefore, the actual production process uses an epitaxial wafer including these layers formed above the substrate 10 in such a manner as to be interposed between the epitaxial layers. However, these layers do not markedly affect the mechanism of the photodetector 1 and are thus omitted from FIG. 1, which schematically illustrates a configuration.

2. Formation Process (Lithography Process)

Figure 2B:
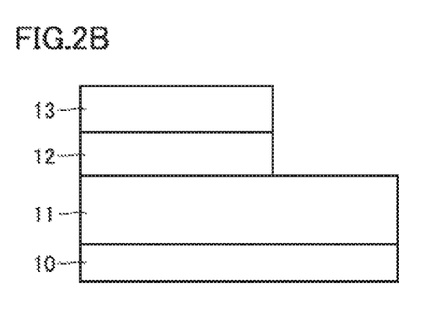
Figure 2C:
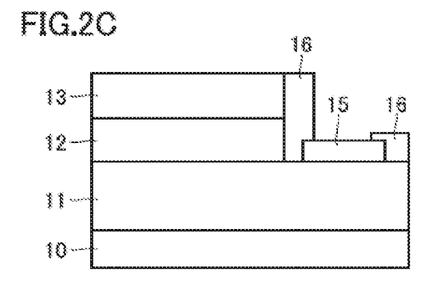

Then, the epitaxial wafer is subjected to wet etching, whereby a part of the epitaxial wafer from the surface of the epitaxial wafer to the lower contact layer 11 is removed as illustrated in FIG. 2B, and a groove is formed. Then, the insulation film 16 is formed, and a part of the insulation film 16 on the surface of the upper contact layer 13 and on the lower contact layer 11 is removed by wet etching. Then, as illustrated in FIG. 2C, the lower electrode 15 formed of gold gallium nitride (AuGeNi) is provided by lift-off on the lower contact layer 11.

Figure 2D:
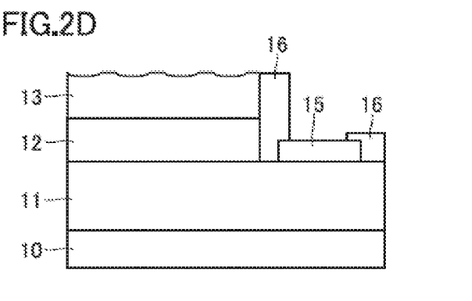
Figure 2E:
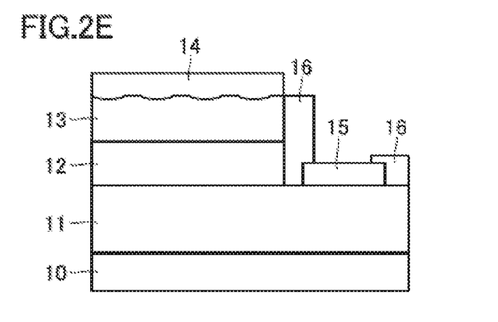

The lower electrode 15 may be formed of a material that can realize ohmic contact with the lower contact layer 11. Then, as illustrated in FIG. 2D, wet etching causes the formation of an uneven structure on the surface of the upper contact layer 13, the uneven structure including projections each having a width of 1.5 µm and having a cycle of 2.0 µm and a height of 100 nm. Then, as illustrated in FIG. 2E, the upper electrode 14 is formed by lift-off.

3. Packaging Process

Photodetectors 1 produced through the above-described processes are split into chips by dicing, and the chips are packaged. A lead wire (not illustrated) extends from each of the upper electrode 14 and the lower electrode 15 and, the upper electrode 14 and the lower electrode 15 are connected to corresponding terminals in the package via the lead wires to be electrically connected to an external circuit.

Surface Wave Generation

Figure 3:
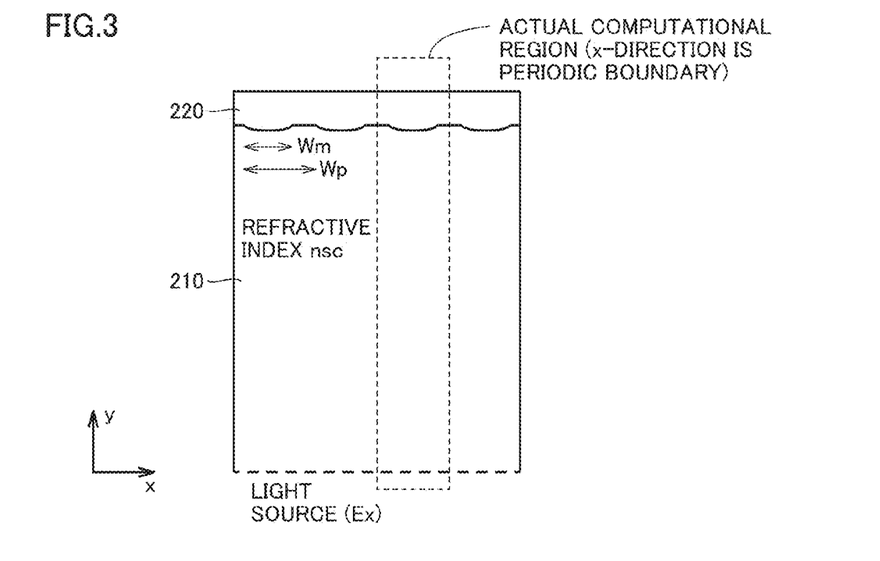
FIG. 3 illustrates a model for an electromagnetic field simulation.

Effects of the uneven structure formed on the upper contact layer 13 will now be described. A light distribution in a stationary state in the case where the uneven structure is irradiated with light was analyzed by an electromagnetic field simulation. FIG. 3 illustrates a model for the electromagnetic field simulation used for computing. As illustrated in FIG. 3, conditions were set as follows: the model includes a semiconductor layer 210 and a metal layer 220, the uneven structure on the surface of the metal layer 220 on the semiconductor layer 210 side correspond to uneven structure on the semiconductor layer 210 in such a manner as to fill depressions in the uneven structure and, in the uneven structure, the cross section of each of the projections has a semiellipsoidal shape with a major axis (Wm) of 1.5 μm and a half minor axis (h) of 100 nm, and the semiellipsoidal shapes are arranged at intervals with a cycle (Wp) of 2.0 μm.

To perform computing in a short time, the computation model was set as a two-dimensional (x-y) cross section, the computational region was set as a single period, and periodic boundary conditions were set for all boundaries in the x-direction. The wave source was set at the lower end in the y-direction, and a sine wave having an electromagnetic vector in the x-direction was used. The wavelength of the sine wave was set to 8 μm, which corresponds to mid-wavelength infrared. In addition, a refractive index $n_{sc}$ of the semiconductor layer 210 was set to 3.28, which is the refractive index of GaAs, and a complex refractive index $n_m$ of the metal layer 220 was set to 8.18-49.3i, which is the complex refractive index of Au.

Note that the wavelength of light in the semiconductor layer 210 is obtained by dividing the original wavelength by the refractive index $n_{sc}$. Therefore, in the case where the wavelength is 8 μm, a wavelength λ of light in the semiconductor layer 210 is about 2.35 μm. Since the cycle in the uneven structure on the surface of the metal layer 220 on the semiconductor layer 210 side is 2.0 μm, the cycle is about 10% less than the wavelength of light in the semiconductor layer 210.

Figure 4:
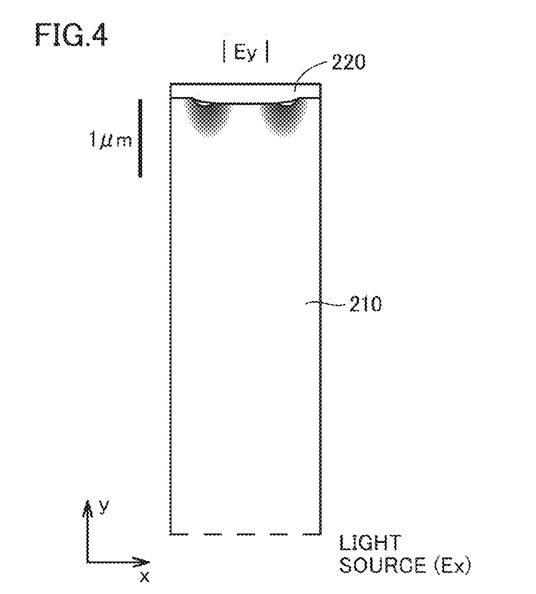
FIG. 4 illustrates a result of the electromagnetic field simulation.

FIG. 4 illustrates a result of the electromagnetic field simulation and illustrates an electric field intensity $|Ey|^2$ in the y-direction in the light distribution in a stationary state. A dark gray portion indicates high $|Ey|^2$. As can be seen from FIG. 4, $|Ey|^2$ is intensely concentrated in regions that are 637 nm deep from the surfaces near both sides of a projection in the uneven structure on the metal layer 220 on the semiconductor layer 210 side. This corresponds to a surface wave generated by light irradiation of the uneven structure having a cycle on the metal layer 220. Note that only the surface wave was generated at this time, and no propagated light was present. That is, it is understood that the incident light (Ex) in the direction perpendicular to the direction in which the above-described epitaxial layers are stacked (hereinafter referred to as a stacking direction) is converted to light (Ey) in the direction parallel to the stacking direction. Furthermore, the surface wave that is confirmed to be generated in FIG. 4 corresponds to light that is allowed to be present only in the immediate vicinity of the metal layer 220 and is hardly present away from the metal layer 220. Therefore, intense light can be locally present in the vicinity of the light absorption layer 12 illustrated in FIG. 1, enabling high photoelectric conversion efficiency to be realized.

The computation performed by the present inventors revealed that, if the cycle Wp is greater than 2.5 μm, $|Ey|^2$ is found to be present not only in the vicinity of the surface of the metal layer 220 on the semiconductor layer 210 side but also in the semiconductor layer 210 away from the metal layer 220 and that the propagated light is present. When the propagated light passes through the light absorption layer 12, it is not possible to use the propagated light for photoelectric conversion. Accordingly, the propagated light does not substantially contribute to detection sensitivity. That is, by reducing the cycle in the uneven structure on the surface of the metal layer 220 on the semiconductor layer 210 side to be less than the wavelength of light in the semiconductor layer 210, which is about 2.35 μm (λ/$n_{sc}$), only the surface wave can be generated. However, simulations performed by the present inventors revealed that the propagated light is generated again if the cycle in the uneven structure on the surface of the metal layer 220 on the semiconductor layer 210 side is less than about half the wavelength of light in the semiconductor layer 210. Therefore, by setting the cycle in the uneven structure on the surface of the metal layer 220 on the semiconductor layer 210 side to be less than the wavelength of light in the semiconductor layer 210 and greater than half the wavelength, it is possible to efficiently generate only the surface wave.

In the case where the thickness of the upper contact layer 13 of the photodetector 1 is about 50 nm as described above, it is possible to superpose the surface wave on the light absorption layer 12 with the upper contact layer 13 interposed therebetween, thereby enabling the photodetector 1 to have high efficiency.

Different Material

Although the case where the material of each of the substrate 10, the lower contact layer 11, the light absorption layer 12, and the upper contact layer 13 is $Al_xGa_{1-x}As$ (0≤x≤1) and where the detected center wavelength λ is 8 μm has been described above, the present inventors also performed computation for semiconductor layers 210 and wavelengths λ illustrated in the following Table 1, the semiconductor layers 210 each being formed of a material other than the above-described GaAs. As a result, it is confirmed that a surface wave of an electric field component in the y-direction is generated in the region that is about 500 nm deep from the surface of the metal layer 220 and that propagated light is not present, as in the above-described case where the semiconductor layer 210 is formed of GaAs.

TABLE 1

| Semi-conductor layer material | λ (μm) | Complex refractive index ($n_m$) of metal layer | Refractive index ($n_{sc}$) of semi-conductor layer | Structure | | |
|---|---|---|---|---|---|---|
| | | | | Wp (μm) | Wm (μm) | h (μm) |
| GaAs | 4.1 | 2.54-26.0i | 3.30 | 1.08 | 0.405 | 0.1 |
| GaN | 4.6 | 3.09-29.0i | 2.25 | 1.4 | 1.2 | 0.1 |

In the case where gallium nitride (GaN), for example, is assumed to be the material of the semiconductor layer 210, the material of the substrate 10 is GaN or sapphire, the material of each of the lower contact layer 11 and the upper contact layer 13 is GaN, and the material of each of the barrier layers 122 of the light absorption layer 12 is $Al_{0.5}Ga_{0.5}N$, and the material of each of the well layers 121 of the light absorption layer 12 is GaN. The thicknesses and doping densities are the same as those in the above-described case of GaAs.

Other Considerations

The above-described materials, the composition of aluminum (Al) and doping densities are only examples, and other materials, compositions, and doping densities may also be used in consideration of factors such as the target wavelength, the easiness of crystal growth, and the easiness of the process.

Three-Dimensional Form

As illustrated in FIG. 4, when irradiation is performed with an electric field component (Ex) in a direction parallel to the direction in which shapes of projections or depressions in the uneven structure are periodically arranged, the uneven structure being provided on the surface of the upper electrode 14 (corresponding to the metal layer 220) on the upper contact layer 13 (corresponding to the semiconductor layer 210) side, a surface wave containing an electric field component (Ey) is generated. By three-dimensionally designing the uneven structure on the upper electrode 14 including the depth direction of each of FIGS. 1 to 4, it is possible to provide various polarization characteristics. Here, FIGS. 5A though 5C each illustrate an exemplary pattern of an uneven structure on the surface of the upper electrode 14 on the upper contact layer 13 side (in a direction opposite to the y-direction).

Figure 5A:
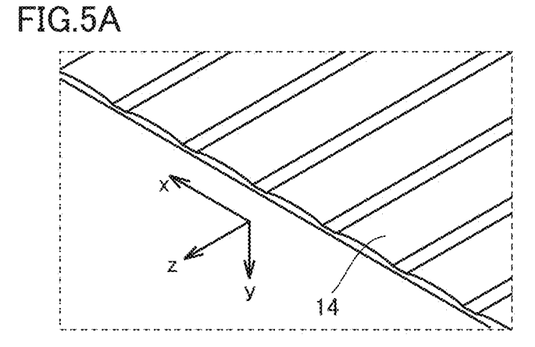
FIGS. 5A though 5C each illustrate an exemplary pattern of an uneven structure on a surface of an upper electrode on an upper contact layer side.

FIG. 5A illustrates a case where shapes of projections or depressions in an uneven structure having a semiellipsoidal cross section are periodically arranged only in the x-direction (where the uneven structure does not include a space and includes linear portions that are periodically arrayed in a predetermined direction). In this case, the surface wave of the electric field component (Ey) in the y-direction is generated only when irradiation is performed with the electric field component (Ex) in the x-direction, and accordingly, the photodetector 1 can selectively detect only the electric field component in the x-direction. In addition, for example, if the uneven structure in FIG. 5A is formed in various directions depending on the position, the photodetector 1 can have sensitivity to a plurality of polarization directions.

Figure 5B:
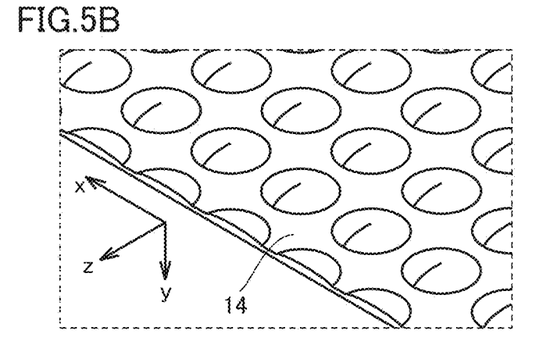

In FIG. 5B, each of the projections in an uneven structure is substantially circular when seen in the stacking direction, and the projections are arranged in a square lattice in the x- and z-directions. In this case, since the cycle is the same in the x- and z-directions, electric field components (Ex and Ez) in both of the x-direction and the z-direction can be detected, and light having an electric field vector in the x-z plane, that is, incident light perpendicular to the photodetector 1 as illustrated in FIG. 1 can be detected.

Figure 5C:
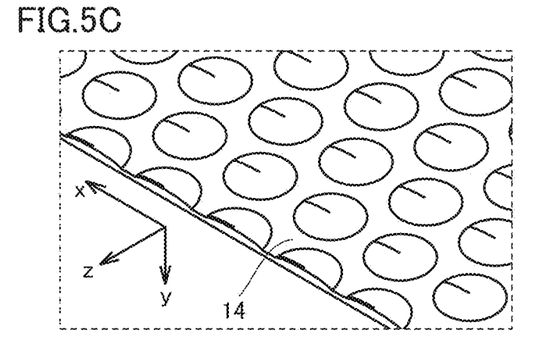

In FIG. 5C, although the shapes of projections or depressions are each the same as those illustrated in FIG. 5b, the projections are arranged in a triangular lattice. In such arrangement, since any electric field component in the x-z plane is converted to Ey with the same intensity, light can be detected regardless of the polarization in the x-z plane.

Other Cross-Sectional Shapes

Figure 6A:
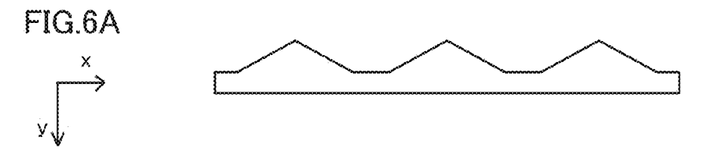
FIGS. 6A through 6C each illustrate an exemplary pattern of a cross section of an uneven structure on the upper electrode.
Figure 6B:
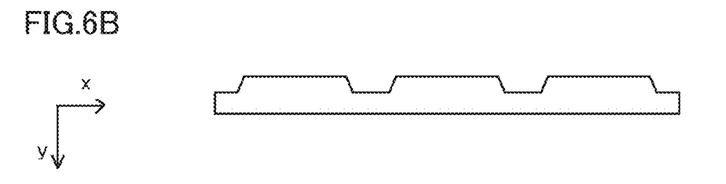
Figure 6C:
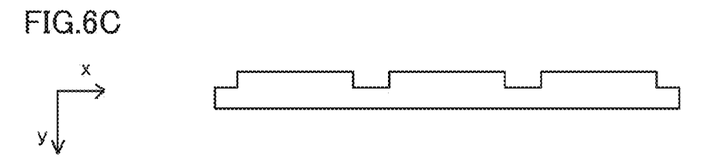

In the conditions in the above description, the cross section of each of the projections in the upper electrode 14 has a semiellipsoidal shape. However, the uneven structure can have other forms. The present inventors confirmed from simulations that as long as the uneven structure has a cycle less than or equal to the wavelength of light in the upper contact layer 13, as in the case of a semiellipsoidal shape, a surface wave of Ey can be generated only in the vicinity of an upper electrode 14. Here, FIGS. 6A through 6C each illustrate an exemplary pattern of a cross section of an uneven structure on the upper electrode 14. For example, any of the triangular cross section illustrated in FIG. 6A, the trapezoidal cross section illustrated in FIG. 6B, and the square cross section illustrated in FIG. 6C is possible, and other shapes are also possible. An uneven structure on an upper contact layer on the substrate side included in a photodetector according to an embodiment of the present invention may not be directly formed in the above manner on the upper contact layer as illustrated in FIGS. 6A to 6C. In addition, it is confirmed from the simulations that the surface wave is similarly generated even when the height of the projection differs. Accordingly, a height other than the height h illustrated in Table 1 is also possible.

Second Embodiment

Figure 7:
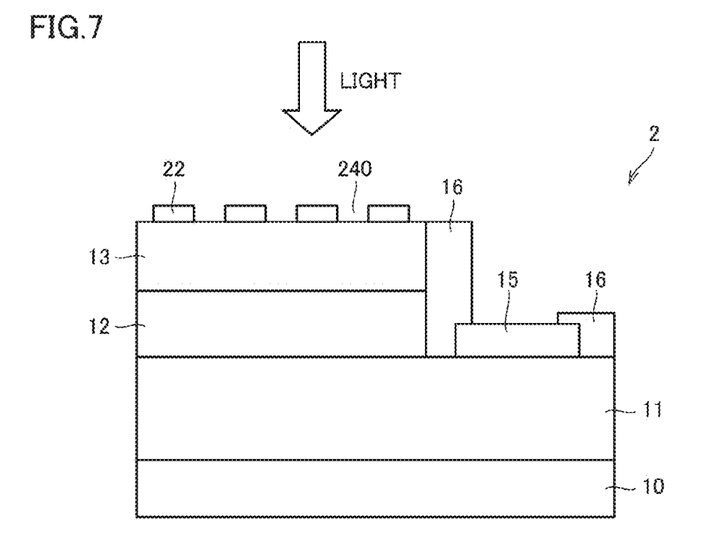
FIG. 7 schematically illustrates a configuration of a photodetector according to a second embodiment.

Next, a photodetector 2 according to a second embodiment will be described with reference to FIG. 7 to FIGS. 10A through 10F. Note that like reference numerals represent the same or similar elements described in the first embodiment, and repeated description thereof is omitted. FIG. 7 schematically illustrates a configuration of the photodetector 2 according to the second embodiment. Although a space may not be present in an uneven structure as in the example illustrated in FIG. 1, a space may be provided at each depression in the uneven structure as in the example illustrated in FIG. 7.

The photodetector 2 has the same configuration as the photodetector 1 with the exception of an upper electrode 22, and light is assumed to be incident from an air layer above the upper electrode 22.

Upper Electrode

In the photodetector 2 in the example illustrated in FIG. 7, the upper electrode 22 is provided in order to extract electrons generated by photoelectric conversion. In addition, the upper electrode 22 has a function of converting the polarization direction of incident light and generating a surface wave in the vicinity of the upper electrode 22 in the semiconductor layer. Holes are formed in parts of the upper electrode 22 so that holes 240 are periodically arranged.

The epitaxial wafer used is the same as that for the photodetector 1 in the first embodiment. The production process is the same as that for the photodetector 1 until the formation of the lower electrode 15 (FIG. 2C). In the case of the photodetector 2, a process for forming an uneven structure on the upper contact layer 13 is unnecessary. Before, after, or concurrently with the formation of the lower electrode 15, the upper electrode 22 including the holes 240 is formed by lift-off. An uneven structure on a side of an upper contact layer, the side being away from the substrate included in a photodetector according to an embodiment of the present disclosure, may not be directly formed on the upper contact layer as in the example illustrated in FIG. 7.

Surface Wave Generation

Figure 8:
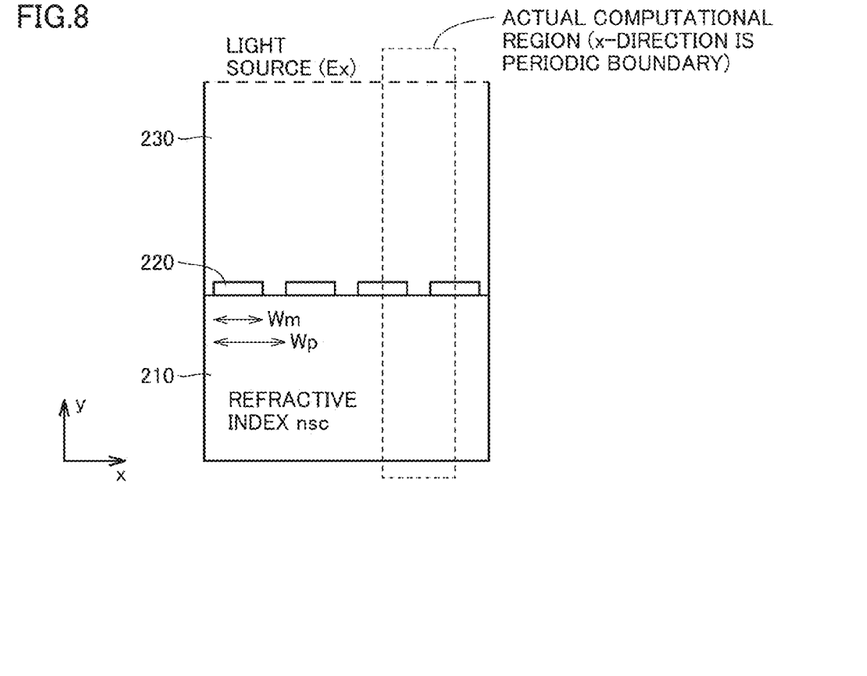
FIG. 8 illustrates a model for an electromagnetic field simulation.

Effects of the holes 240 will be described while describing the results of electromagnetic field simulations in the same manner as in the first embodiment. FIG. 8 illustrates a model used for computing. Conditions were set as follows: the model includes a semiconductor (GaAs) layer 210, a metal (Au) layer 220, and an air layer 230, and the metal layer 220 includes metal portions each having a width (Wm) of 0.5 µm and a height (h) of 100 nm and arranged at intervals with a cycle (Wp) of 2.0 µm. To perform computing in a short time, the computation model was set as a two-dimensional (x-y) cross section, the computational region was set as a single period, and periodic boundary conditions were set for all boundaries in the x-direction. The wave source was set at the upper end in the y-direction in the air layer 230, and a sine wave having an electromagnetic vector in the x-direction was used. The wavelength of the sine wave was set to 8 µm, which corresponds to mid-wavelength infrared. In addition, a refractive index $n_{sc}$ of the semiconductor layer 210 was set to 3.28, which is the refractive index of GaAs, a complex refractive index $n_m$ of the metal layer 220 was set to 8.18-49.3i, which is the complex refractive index of Au, and the refractive index of the air was set to 1. Note that the wavelength of light in the semiconductor layer 210 is obtained by dividing the original wavelength by the refractive index $n_{sc}$. Therefore, in the case where the wavelength is 8 µm, a wavelength λ of light in the semiconductor layer 210 is about 2.35 µm. Since the cycle in the uneven structure on the surface of the metal layer 220 is 2.0 µm, the cycle is about 10% less than the wavelength of light in the semiconductor layer 210.

Figure 9:
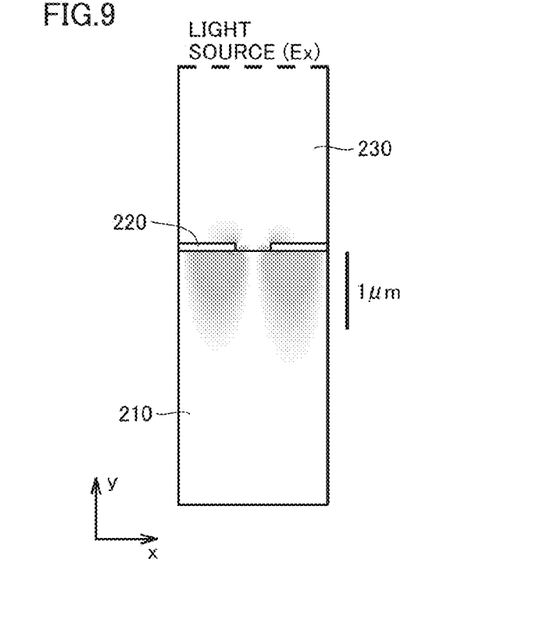
FIG. 9 illustrates a result of the electromagnetic field simulation.

FIG. 9 illustrates an electric field intensity $|Ey|^2$ in the y-direction in a light distribution in a stationary state. In FIG. 9, a dark gray portion indicates high $|Ey|^2$. As can be seen from FIG. 9, $|Ey|^2$ is intensely concentrated in a region that is about 630 nm deep from the surface of the metal layer 220 around the holes on the semiconductor layer 210 side. This corresponds to a surface wave generated by a surface plasmon propagating to the rear side of the metal layer 220, the surface plasmon having been generated by light irradiation of the uneven structure having a cycle on the metal layer 220 through the air layer 230.

In the photodetector 2, it is possible to generate a surface wave in the direction opposite to the surface of the upper electrode 22 irradiated with light. As in the photodetector 1, by setting the cycle in the uneven structure to be less than the wavelength of light in the semiconductor layer 210, which is about 2.35 µm (λ/$n_{sc}$), it is possible to generate only the surface wave. In the case where the thickness of the upper contact layer 13 of the photodetector 2 is about 50 nm as described above, it is possible to superpose the surface wave on the light absorption layer 12 with the upper contact layer 13 interposed therebetween, thereby enabling the photodetector 2 to have high efficiency.

Different Material

Although the case where the material of each of the substrate 10, the lower contact layer 11, the light absorption layer 12, and the upper contact layer 13 is $Al_xGa_{1-x}As$ (0≤x≤1) and where the detected center wavelength λ is 8 µm has been described above, the present inventors also performed computation for a semiconductor layer 210 and a wavelength λ illustrated in the following Table 2, the semiconductor layer 210 being formed of a material other than the above-described GaAs. As a result, it is confirmed that a surface wave of an electric field component in the y-direction is generated in the region that is about 500 nm deep from the surface of the metal layer 220 and that propagated light is not present, as in the case where the above-described semiconductor layer is formed of GaAs.

TABLE 2

| Semi-conductor layer material | λ (µm) | Complex refractive index ($n_m$) of metal layer | Refractive index ($n_{sc}$) of semi-conductor layer | Structure Wp (µm) | Wm (µm) | h (µm) |
|---|---|---|---|---|---|---|
| GaAs | 4.1 | 2.54-26.0i | 3.30 | 1.05 | 0.254 | 0.1 |
| GaN | 4.6 | 3.09-29.0i | 2.25 | 1.88 | 0.45 | 0.1 |

In the case where GaN, for example, is assumed to be the material of the semiconductor layer 210, the material of the substrate 10 is GaN or sapphire, the material of each of the lower contact layer 11 and the upper contact layer 13 is GaN, and the material of each of the barrier layers 122 of the light absorption layer 12 is $Al_{0.5}Ga_{0.5}N$, and the material of each of the well layers 121 of the light absorption layer 12 is GaN. The thicknesses and doping densities are the same as those in the above-described case of GaAs.

Three-Dimensional Form

Figure 10A:
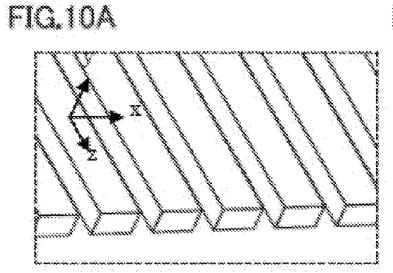
FIGS. 10A through 10G each illustrate an exemplary pattern of an uneven structure on an upper electrode.

FIGS. 10A though 10F each illustrate an exemplary pattern of an uneven structure on the upper electrode 22 of the photodetector 2 according to the second embodiment. FIG. 10G illustrates plan views of the exemplary patterns of uneven structures of FIGS. 10A through 10F.

FIG. 10A illustrates a case where linear portions are periodically arranged only in the x-direction to form the upper electrode 22. In this case, the surface wave of an electric field component (Ey) in the y-direction is generated only in the case where irradiation is performed with an electric field component (Ex) in the x-direction. Accordingly, the photodetector 2 can selectively detect only the electric field component in the x-direction.

Figure 10B:
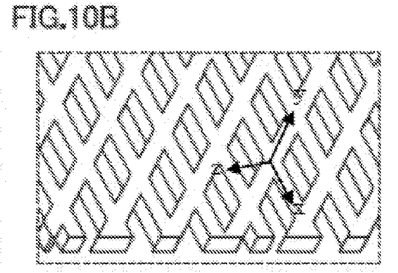

FIG. 10B illustrates a case where linear portions are periodically arranged in the x-direction and in the direction that has an inclination of 45 degrees from the x-direction to form the upper electrode 22 shaped as a mesh (where a space is provided at each depression in the uneven structure and where the uneven structure includes linear portions that are periodically arranged in two or more directions and cross each other to be mesh-shaped). In this case, surface waves of the electric field component (Ex) in the x-direction and of an electric field component in the direction having an inclination of 45 degrees from the x-direction are generated. Accordingly, the photodetector 2 can selectively detect the electric field component in the x-direction and the electric field component in the direction having an inclination of 45 degrees from the x-direction.

Figure 10C:
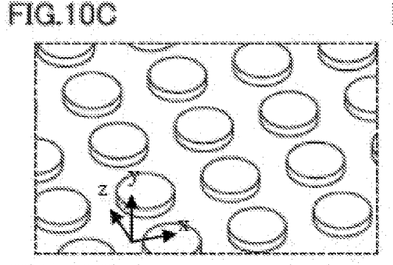
Figure 10D:
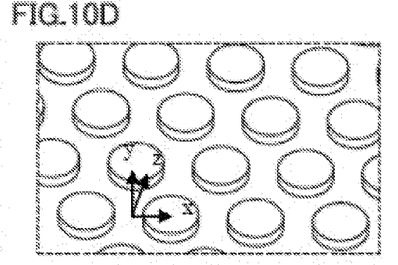
Figure 10E:
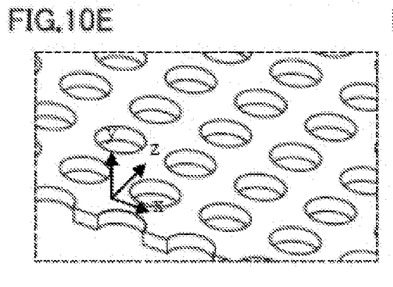

In FIG. 10C, disk-like structures are arranged in a square lattice in the x- and z-directions; in FIG. 10E, circular holes are arranged in a square lattice in the x- and z-directions (a space is provided at each depression in the uneven structure, each projection in the uneven structure when seen in the stacking direction is substantially circular, and the projections are periodically arranged in a triangular lattice). In these cases, since the cycles in the x-direction and the z-direction are the same, both Ex and Ez can be detected. Accordingly, light having an electric field vector in the x-z plane, that is, incident light that is perpendicular to the photodetector as illustrated in FIG. 1 can be detected.

Figure 10F:
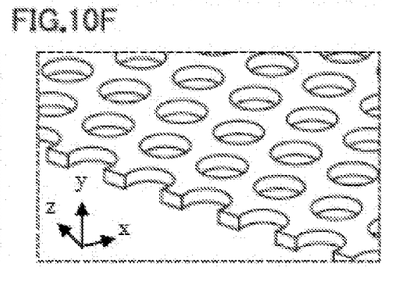
Figure 10G:
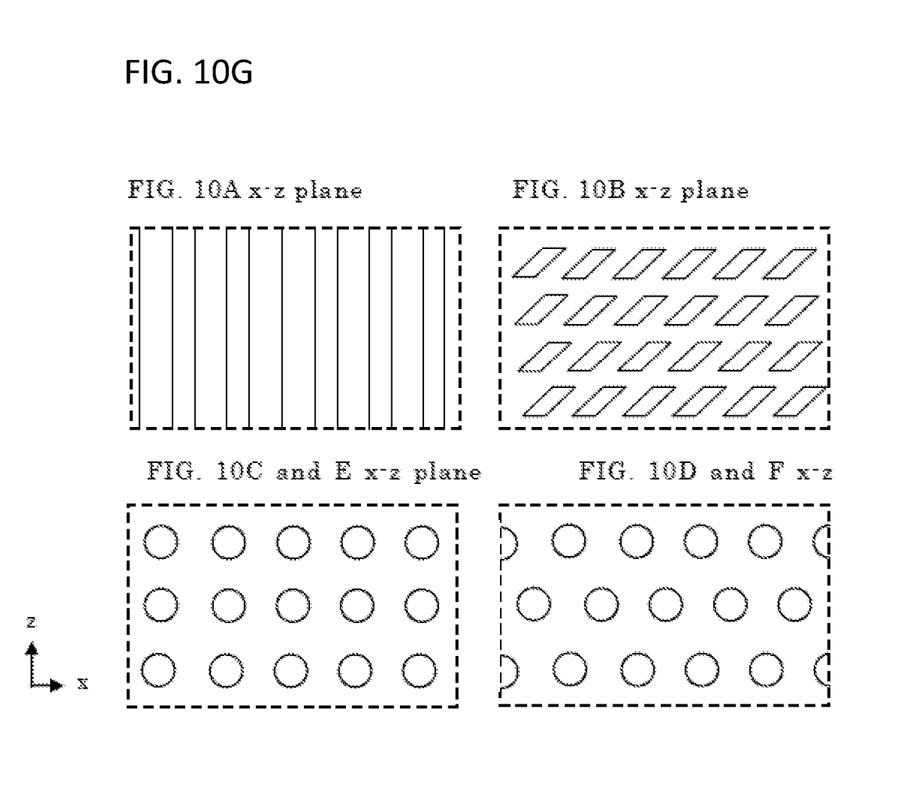

In FIG. 10D, disk-like structures are arranged in a triangular lattice; in FIG. 10F, circular holes are arranged in a triangular lattice. In such arrangement, since any electric field component in the x-z plane is converted to Ey with the same intensity, light can be detected regardless of the polarization in the x-z plane.

Patterning of circular holes as in FIG. 10E and FIG. 10F makes it easy to electrically connect the entire upper electrode. On the other hand, it is easy to have a wider opening in the case of FIG. 10C and FIG. 10D than in the case of FIG. 10E and FIG. 10F.

In addition, in FIG. 10A, FIG. 10C, and FIG. 10D each of the electrodes may be connected by using a wire (not illustrated) so that each of the electrodes is electrically connected. Alternatively, output of the photodetector 2 may be extracted only from a part of the upper electrode 22, and the other part of the upper electrode 22 may not be used as an electrode and may be used only for conversion of the polarization direction.

The present disclosure contains subject matter related to that disclosed in Japanese Priority Patent Application JP 2015-225859 filed in the Japan Patent Office on Nov. 18, 2015, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A photodetector comprising:
    a substrate;
    a light absorption layer arranged over the substrate, the light absorption layer including a semiconductor layer that includes a quantum well structure that absorbs light of a wavelength depending on the quantum well structure;
    a lower contact layer arranged on a side of the light absorption layer, the side being adjacent to the substrate;
    a lower electrode provided to contact with the lower contact layer;
    an upper contact layer arranged on a side of the light absorption layer, the side being father away from the substrate than the lower contact layer; and
    an upper electrode provided to contact with the upper contact layer,
    wherein an uneven structure including shapes of projections or depressions on the side of the upper contact layer away from the substrate is provided, the shapes of projections or depressions each having a size less than or equal to a wavelength of incident light in the semiconductor layer and greater than or equal to half the wavelength, having a polarization selectivity, and being periodically arranged in at least one direction.

2. The photodetector according to claim 1, wherein the uneven structure is formed on the upper electrode.

3. The photodetector according to claim 1, wherein the uneven structure includes projections or depressions that are substantially circular when viewed in a stacking direction and that are periodically arranged in a triangular lattice.

4. The photodetector according to claim 1, wherein the uneven structure does not include a space.

5. The photodetector according to claim 1, wherein a space is provided at a depression in the uneven structure.

6. The photodetector according to claim 4, wherein the uneven structure includes linear portions that are periodically arrayed in a predetermined direction.

7. The photodetector according to claim 5, wherein the uneven structure includes linear portions that are periodically arranged in two or more directions and cross each other to be mesh-shaped.

* * * * *